(12) United States Patent
Lee

(10) Patent No.: US 9,048,134 B2
(45) Date of Patent: Jun. 2, 2015

(54) MEMORY DEVICE AND METHOD FOR MANUFACTURING THE SAME

(71) Applicant: INOTERA MEMORIES, INC., Taoyuan County (TW)

(72) Inventor: Tzung-Han Lee, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/165,790

(22) Filed: Jan. 28, 2014

(65) Prior Publication Data

US 2015/0076696 A1  Mar. 19, 2015

(30) Foreign Application Priority Data

Sep. 13, 2013  (TW) .............................. 102133184 A

(51) Int. Cl.
| | |
|---|---|
| H01L 21/336 | (2006.01) |
| H01L 27/108 | (2006.01) |
| H01L 23/532 | (2006.01) |
| H01L 21/768 | (2006.01) |

(52) U.S. Cl.
CPC .... *H01L 27/10897* (2013.01); *H01L 27/10885* (2013.01); *H01L 23/53238* (2013.01); *H01L 21/76846* (2013.01)

(58) Field of Classification Search
CPC .................. H01L 21/76846; H01L 27/10885; H01L 27/10897; H01L 23/53238
USPC ........................................ 438/262; 257/68, 71
See application file for complete search history.

(56) References Cited

U.S. PATENT DOCUMENTS

| | | | | |
|---|---|---|---|---|
| 5,365,082 | A  * | 11/1994 | Gill et al. ........................ | 257/374 |
| 6,455,886 | B1 * | 9/2002 | Mandelman et al. .......... | 257/301 |
| 6,621,119 | B1 * | 9/2003 | Wu ................................ | 257/321 |
| 6,624,460 | B1 * | 9/2003 | Huang et al. ................... | 257/296 |
| 6,710,381 | B1 * | 3/2004 | Huang et al. ................... | 257/217 |
| 2005/0221511 | A1 * | 10/2005 | Wang et al. ........................ | 438/3 |
| 2006/0148227 | A1 * | 7/2006 | Kronke et al. ................. | 438/586 |
| 2011/0223731 | A1 * | 9/2011 | Chung et al. ................... | 438/270 |

* cited by examiner

*Primary Examiner* — Nicholas Tobergte
(74) *Attorney, Agent, or Firm* — Rosenberg, Klein & Lee

(57) ABSTRACT

A memory device comprises a substrate, a plurality of buried word lines, a plurality of digital contacts, a patterned insulating layer, a liner layer, a plurality of buried bit lines, and a cap layer. The buried word lines are arranged in the substrate in parallel along a first direction. Each of the digital contacts is arranged between one pair of the neighboring buried word lines. The patterned insulating layer is arranged on the buried word lines, having a plurality of contact holes opposite to the digital contacts. The liner layer is arranged on the substrate, and abuts the patterned insulating layer. The buried bit lines are arranged in parallel along a second direction different from the first direction. The cap layer arranged to cover the buried bit lines.

13 Claims, 4 Drawing Sheets

MEMORY DEVICE AND METHOD FOR MANUFACTURING THE SAME

BACKGROUND OF THE INVENTION

1. Field of the Invention

The instant disclosure relates to a semiconductor element and manufacturing method thereof; in particular, to a memory device with novel structural bit lines and method for manufacturing the same.

2. Description of Related Art

Semiconductor memory device is an electronic data storage device that uses the electrical property of capacitance to store the bits of data. In recent years, miniaturization of memory cells has been achieved in semiconductor devices such as DRAM, and thus an increase in the number of memory cells connected to a bit line has caused a performance problem such as an increase in bit line capacitance.

DRAM is one type of volatile memory including plural memory cells. Each of the memory cells has a transistor and a capacitor coupled to the transistor. The electronic connection between neighboring memory cells can be achieved via word lines and bit lines.

In general, traditional memory device comprises a substrate, plural word lines embedded in the substrate, an insulating (oxide) layer disposed on the word lines, and plural bit lines disposed on the substrate. It is notable that each traditional bit line consists of a first polysilicon layer, a second polysilicon layer, and a conducting layer in a stacking arrangement. However, in the production of high-density integrated circuits, the miniaturized traditional bit lines may cause bigger contact resistance due to its narrow dimension, such that bit line loading is generated by lower current of the memory cells. Further, the subsequent formed word lines has coupling and pipe issues due to its step height.

Although the problem of high contact resistance can be reduced by increasing the junction depth of the word lines, but the increment of the junction depth can cause further problems of short channel effect and junction leakage. Furthermore, although the word lines with heavy dopant doped shallow junctions can prevent the problems of short channel effect and junction leakage, but are not arranged to achieve the bit line loading effect due to the restrict of solid solubility.

SUMMARY OF THE INVENTION

The object of the instant disclosure is to provide a memory device with novel structural buried bit lines and a method for manufacturing the same.

In order to achieve the aforementioned objects, according to an embodiment of the instant disclosure, a memory device comprises a substrate, a plurality of buried word lines, a plurality of digital contacts, a patterned insulating layer, a liner layer, a plurality of buried bit lines, and a cap layer. The buried word lines are arranged in the substrate in parallel along a first direction. Each of the digital contacts is arranged between one pair of the neighboring buried word lines. The patterned insulating layer is arranged on the buried word lines, having a plurality of contact holes opposite to the digital contacts. The liner layer is arranged on the substrate, and abuts the patterned insulating layer. The buried bit lines are arranged in parallel along a second direction different from the first direction, wherein each buried bit line comprising a barrier layer and a conducting layer. The barrier layer is arranged on the patterned insulating layer and the liner layer, and covers the contact holes in a uniform conformal manner to connect to the digital contacts. The conducting layer is arranged on the barrier layer and filled in the contact holes. The cap layer arranged to cover the buried bit lines.

According to the embodiment of the instant disclosure, a method for manufacturing memory device comprises the following steps. The first step is forming a plurality of buried word lines in the substrate in a parallel arrangement. The next step is forming a plurality of digital contacts in the substrate at intervals with the buried word lines. The next step is forming a patterned insulating layer on the substrate, wherein the patterned insulating layer has a plurality of contact holes opposite to the digital contacts respectively. The next step is forming a liner layer on the substrate adjacent to a side of the patterned insulating layer. The next step is forming a barrier layer on the patterned insulating layer and the liner layer, wherein the barrier layer conformally covers the contact holes in to connect to the digital contacts. The next step is forming a conducting layer on the barrier layer and filling the contact holes. The last step is forming a cap layer to cover the conducting layer.

Base on above, the instant buried word line includes a barrier layer which is configured to replace with a polysilicon layer of the traditional buried word line, thereby decreasing the contact resistance. Thus, the instant memory device with high performance can be achieved with high current conductance.

Furthermore, the decreased contact resistance can allow each instant buried word line to become thinner to prevent short channel effect caused by coupling issue and pipe issue. Therefore, the stability of the instant memory device can be increased.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
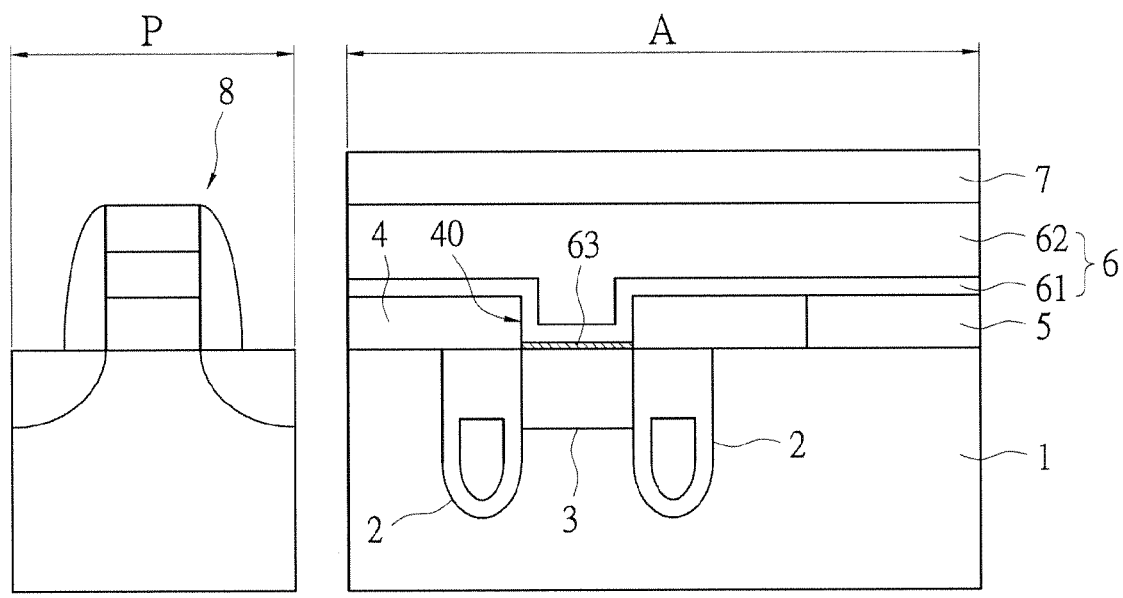
FIG. 1 shows a cross-sectional diagram of a memory device according to an embodiment of the instant disclosure.

FIG. 1 is a cross-sectional view illustrating a memory device according to an embodiment of the prevent invention.

Referring to FIG. 1, the memory device 100 comprises a substrate 1, a plurality of buried word lines 2, a plurality of digital contacts 3, a patterned insulating layer 4, a liner layer 5, a plurality of buried bit lines 6, and a cap layer 7.

In an embodiment, the substrate 1 has an array region A and a peripheral region P thereon, and where the peripheral region P is arranged on the outer side with respect to the array region A. The buried word lines 2 are arranged in the array region A of the substrate 1 in parallel along a first direction (y-direction). Each of the digital contacts 3 is arranged between one pair of the neighboring buried word lines 2. Thus, an electrical connection is maintained between the buried word lines 2 and the substrate 10 through the digital contacts 3. The patterned insulating layer 4 is arranged to covers the buried word lines 2, having a plurality of contact holes 40 opposite to the digital contacts 3. The liner layer 5 is arranged on the array region P, and abuts the patterned insulating layer 4. The buried bit lines 6 are arranged in parallel along a second direction (x-direction) different from the first direction. The cap layer 7 is arranged to cover the buried bit lines 6.

Moreover, the memory device 100 comprises a vertical transistor 8 and a plurality of semiconductor pillars (not shown). The vertical transistor 8 is arranged on the peripheral region P of the substrate 10. The semiconductor pillars are arranged above the array region A of the substrate 10 in a matrix format, wherein each semiconductor pillar can function as an active area of a vertical channel of the relative vertical transistor 8.

It is preferable that each buried bit line 6 comprises a barrier layer 61 and a conducting layer 62 stacked on the barrier layer 6. The barrier layer 61 is arranged on the patterned insulating layer 4 and the liner layer 5, and covers the contact holes 40 in a uniform conformal manner to connect to the digital contacts 3. The conducting layer 62 is arranged on the barrier layer 61 and filled in the contact holes 40. Specially, there is a metal silicide layer 63 formed by a reaction between the barrier layer 61 and the substrate 1 (silicon substrate), thereby reducing the contact resistance of the memory device 1. Therefore, the decreased contact resistance can allow each buried word line 2 to become thinner to prevent short channel effect caused by coupling issue and pipe issue, such that the stability of the instant memory device can be increased.

Figure 2:
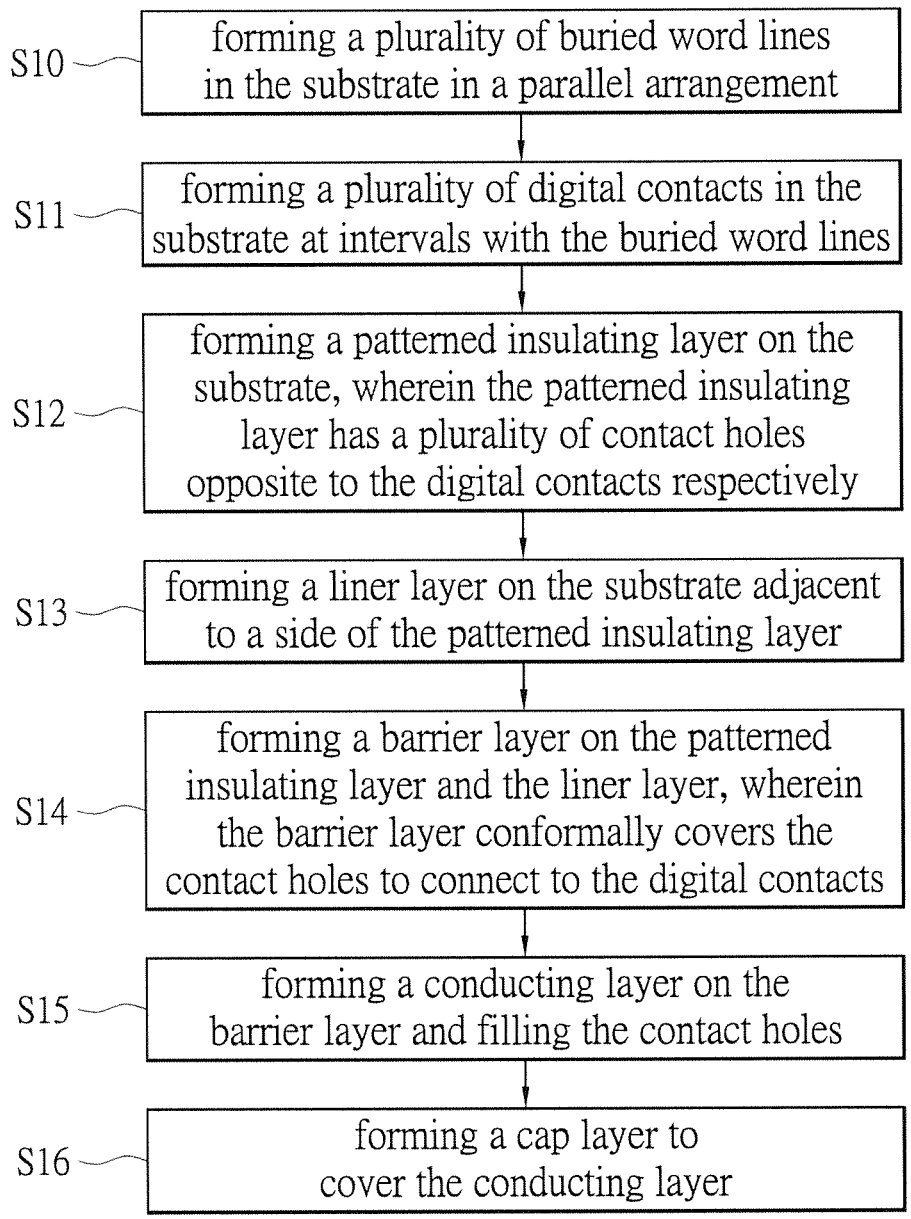
FIG. 2 shows a process flow diagram of a method for manufacturing memory device according to an embodiment of the instant disclosure.
Figure 3:
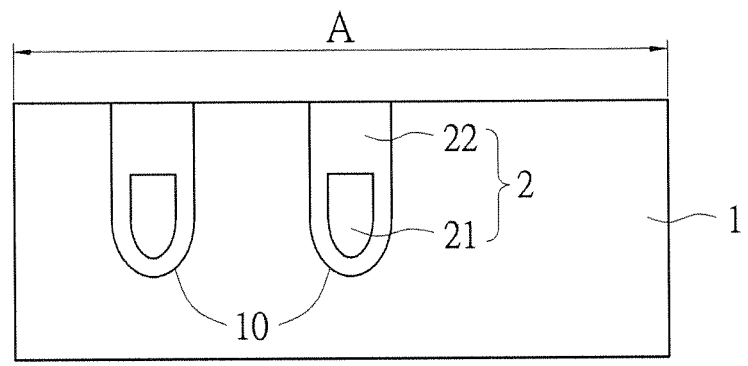
FIGS. 3 to 4 show cross-sectional diagrams illustrating the processing steps of the method for manufacturing memory device.
Figure 4:
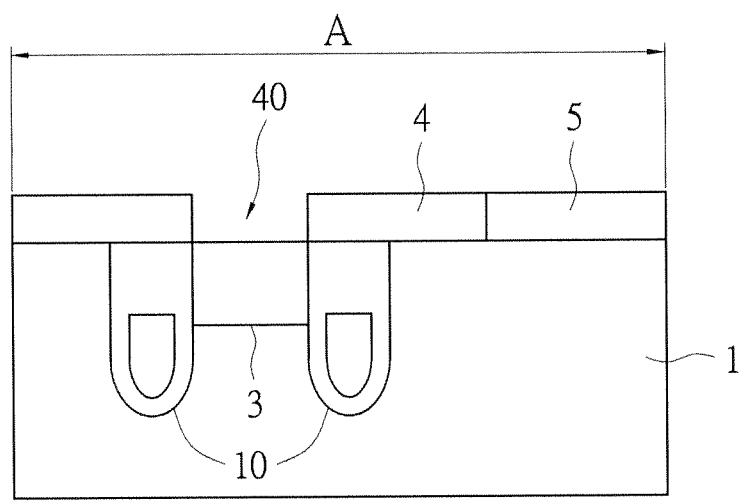

Referring to FIGS. 2 to 4, following will describe the manufacturing method of the memory device 1, such that any person skilled in the art can further understand the instant technical features and effects, and carry out the instant disclosure. It is notable that the forming methods, forming sequence, and materials of the elements mentioned above may be adjusted by any person skilled in the art.

FIG. 2 is a process flow view illustrating a method for manufacturing memory device according to an embodiment of the prevent invention. FIGS. 3 to 4 are cross-sectional views illustrating the processing steps of the method.

Referring to FIG. 3, the method begins at step S10 of forming a plurality of buried word lines 2 in the substrate 1 in a parallel arrangement. Concretely speaking, a photoresistance capable of defining a plurality of parallel trenches 10 that extend in a first direction (y-direction) can be formed in one performance of the process of lithography. Followed on, each of plural trenches 10 is filled up with a conducting body 21 and an interlayer dielectric layer 22 covered the conducting body 21.

To provide further explanations, the electrically conducting body 21 is made of a pure metal or a metal alloy. The pure metal can, for example, be selected from the group of wolfram (W), copper (Cu), or aluminum (Al), wherein W is preferable. The metal alloy can, for example, be selected from the group of Al—Cu alloy or W—Al—Cu alloy. The interlayer dielectric layer 22 includes a tetra-ethyl-ortho silicate glass (TEOS) material, a boro-phospho-tetra-ethyl-ortho silicate glass material, or a boro-phosphosilicate glass (BPSG) material.

Afterward, the step S11, with reference to FIG. 4, is to form a plurality of digital contacts 3. Concretely speaking, the process of lithography is conducted to form a patterned photoresistance (not shown) to cover the buried word lines 2 and partially expose the surface of the substrate 1. Since the process of lithography defines plural spaces among the buried word lines 2. Followed on, the substrate 1 is formed with the digital contacts 3 (P/AS-doped areas) at intervals with the buried word lines 2 by an ion implantation process taking the patterned photoresistance as a mask. In other words, each of the digital contacts 3 is arranged between one pair of the neighboring buried word lines 2.

Afterward, the step S12 is to form a patterned insulating layer 4 to cover the buried word lines 2, wherein the patterned insulating layer 4 has a plurality of contact holes 40. In practice, the patterned insulating layer 4 can be oxide layer (silicon oxide layer) whose thickness ranges between 300 Å to 700 Å, preferably about 500 Å, is formed in one performance of the process of chemical vapor deposition (CVD). Furthermore, the oxide layer is formed with a plurality of contact holes 40 via a self-aligned contact (SAC), and the contact holes 40 one to one the digital contacts 3.

Afterward, the step S13 is to form a liner layer 5 on the substrate 1 adjacent to a side of the patterned insulating layer 4. Concretely speaking, the liner layer 5 is a polysilicon layer formed by mean of deposition where the polysilicon layer is covered on the patterned insulating layer 4 and the exposed surface of the substrate 1. Followed on, the liner layer 5 is etched or planarized to remain the liner layer 5 only on the exposed surface of the substrate 1 adjacent to the side of the patterned insulating layer 4. The thickness of the liner layer 5 ranges between 400 Å to 800 Å, preferably about 600 Å.

Afterward, the step S14 is to form a barrier layer 61 on the patterned insulating layer 4 and the liner layer 5, where the barrier layer 61 conformally covers the contact holes 40 and connects to the digital contacts 3. Afterward, the step S15 is to form a conducting layer 62 on the barrier layer 61, where the conducting layer 62 can fill up the contact holes 40. In one exemplary embodiment, the conducting layer 62 whose thickness ranges between 200 Å to 500 Å, preferably about 350 Å can be abovementioned pure metal or metal alloy. The method stops at step S16 of forming a cap layer 7 to cover the conducting layer 62, where the cap layer is, but not limited to, silicon oxide or silicon nitride.

Through abovementioned steps, the instant memory device 100 can be achieved, and the barrier layer 61 and the conducting layer 62 can be configured to construct the buried bit lines. However, the instant disclosure can be applied and modified by any person skilled in the art.

Figure 5:
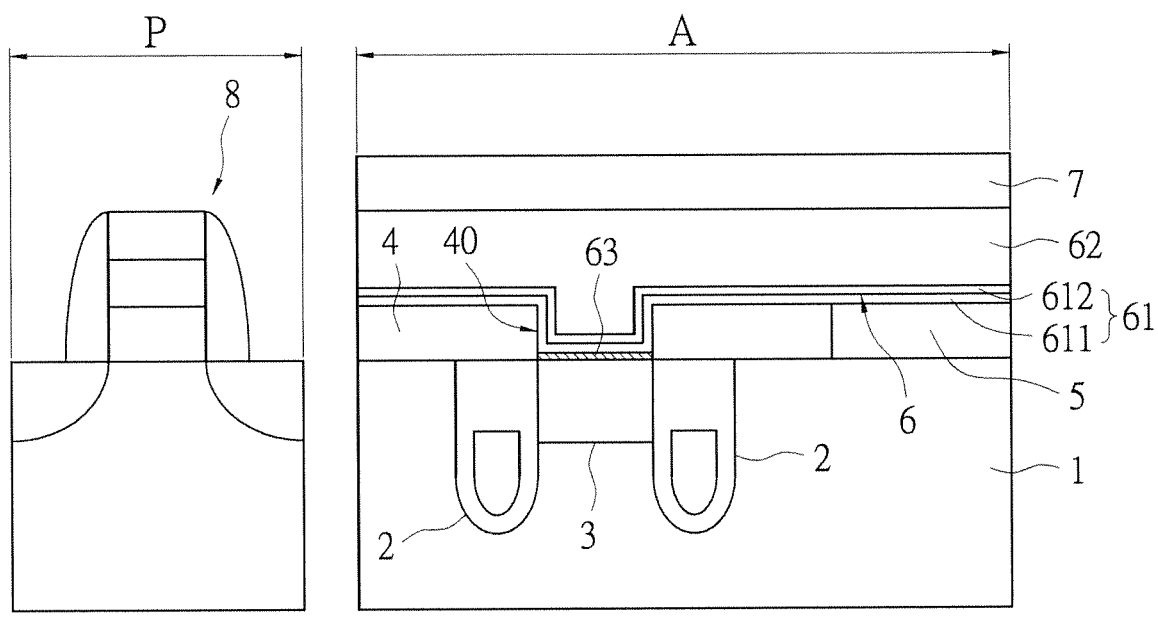
FIG. 5 shows a cross-sectional diagram of the memory device according to another embodiment of the instant disclosure.

FIG. 5 is a cross-sectional view illustrating a memory device according to another embodiment of the prevent invention. The barrier layer 61, with reference to FIG. 5, is a double-layer structure consisting of a first barrier layer 611 and a second barrier layer 612. In practice, each of the first and second barrier layers 611, 612 is, but not limited to, a titanium barrier layer, a titanium nitride barrier layer, and a cobalt barrier layer. Specially, a metal silicide layer 63 can also be formed by a reaction between the barrier layer 61 and the substrate 1 (silicon substrate), thereby reducing the contact resistance of the memory device 1. It is notable that the barrier layer 61 can be a multi-layer structure selected from the group consisting of a titanium barrier layer, a titanium nitride barrier layer, and a cobalt barrier layer.

Base on above, the instant memory device, compared with the traditional one, has the following advantages: each instant buried word line includes a barrier layer which is configured to replace with a polysilicon layer of the traditional buried word line, thereby decreasing the contact resistance. Thus, the instant memory device with high performance can be achieved with high current conductance.

Further, the decreased contact resistance can allow each instant buried word line to become thinner to prevent short channel effect caused by coupling issue and pipe issue. Therefore, the stability of the instant memory device can be increased.

Furthermore, a metal silicide layer can be formed directly via a reaction between the barrier layer and the substrate, such that the bottom portion of the buried word lines can electrically communicate with the digital contacts with only minor change in deposition. Therefore, the product process of the instant memory device can be easily integrated. Hence, the efficiency of the subsequent formed elements can be increased significantly.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A memory device, comprising:
   a substrate has an array region and a peripheral region outside the array region;
   a plurality of buried word lines arranged in the array region in parallel along a first direction;
   a plurality of digital contacts, each of which is arranged between one pair of the neighboring buried word lines;
   a patterned insulating layer arranged on the buried word lines, having a plurality of contact holes opposite to the digital contacts;
   a liner layer arranged on the array region, and abuts the patterned insulating layer; and
   a plurality of buried bit lines arranged in parallel along a second direction different from the first direction, wherein each buried bit line comprising:
      a barrier layer arranged on the patterned insulating layer and the liner layer, and covers the contact holes in a uniform conformal manner to connect to the digital contacts; and
      a conducting layer arranged on the barrier layer and filled in the contact holes;
   a cap layer arranged to cover the buried bit lines.

2. The memory device according to claim 1, wherein the barrier layer is a titanium barrier layer, a titanium nitride barrier layer, or a cobalt barrier layer.

3. The memory device according to claim 2, further comprising a metal silicide layer formed by a reaction between the barrier layer and the substrate.

4. The memory device according to claim 1, wherein the barrier layer is a multi-layer structure selected from the group consisting of a titanium barrier layer, a titanium nitride barrier layer, and a cobalt barrier layer.

5. The memory device according to claim 4, further comprising a metal silicide layer formed by a reaction between the barrier layer and the substrate.

6. The memory device according to claim 1, further comprising a vertical transistor arranged on the peripheral region.

7. The memory device according to claim 1, wherein the substrate has a plurality of trenches, the buried word lines are respectively arranged in the trenches, each buried word line comprises an electrically conducting body and an interlayer dielectric layer between the substrate and the electrically conducting body.

8. The memory device according to claim 7, wherein each electrically conducting body is wolfram, the interlayer dielectric layer includes a tetra-ethyl-ortho silicate glass (TEOS) material, a boro-phospho-tetra-ethyl-ortho silicate glass material, or a boro-phosphosilicate glass (BPSG) material.

9. A method for manufacturing memory device, comprising the following steps:
   forming a plurality of buried word lines in the substrate in a parallel arrangement;
   forming a plurality of digital contacts in the substrate at intervals with the buried word lines;
   forming a patterned insulating layer on the substrate, wherein the patterned insulating layer has a plurality of contact holes opposite to the digital contacts respectively;
   forming a liner layer on the substrate adjacent to a side of the patterned insulating layer;
   forming a barrier layer on the patterned insulating layer and the liner layer, wherein the barrier layer conformally covers the contact holes to connect to the digital contacts;
   forming a conducting layer on the barrier layer and filling the contact holes; and
   forming a cap layer to cover the conducting layer.

10. The memory device according to claim 9, wherein the barrier layer is a titanium barrier layer, a titanium nitride barrier layer, or a cobalt barrier layer.

11. The memory device according to claim 10, further comprising a metal silicide layer formed by a reaction between the barrier layer and the substrate.

12. The memory device according to claim 9, wherein the barrier layer is a multi-layer structure selected from the group consisting of a titanium barrier layer, a titanium nitride barrier layer, and a cobalt barrier layer.

13. The memory device according to claim 12, further comprising a metal silicide layer formed by a reaction between the barrier layer and the substrate.

* * * * *